United States Patent
Machida

(10) Patent No.: US 7,829,378 B2
(45) Date of Patent: Nov. 9, 2010

(54) METHOD OF MANUFACTURING ELECTRONIC DEVICE, SUBSTRATE AND SEMICONDUCTOR DEVICE

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 117 days.

(21) Appl. No.: 12/044,397

(22) Filed: Mar. 7, 2008

(65) Prior Publication Data

US 2008/0230897 A1 Sep. 25, 2008

(30) Foreign Application Priority Data

Mar. 20, 2007 (JP) .............................. 2007-072706

(51) Int. Cl.
*H01L 21/44* (2006.01)
*H01L 21/48* (2006.01)
*H01L 21/50* (2006.01)

(52) U.S. Cl. ...................... 438/106; 438/118; 438/613; 257/E21.17; 257/E21.237; 257/E21.499; 257/E21.502; 257/E21.508

(58) Field of Classification Search ......... 438/612–617, 438/633, 692, 759, 959, 106, 112, 118, 124, 438/127, 121, 680; 257/E21.17, 237, 499, 257/502, 508

See application file for complete search history.

(56) References Cited

U.S. PATENT DOCUMENTS

| 5,592,736 | A  | * | 1/1997 | Akram et al. .................. 29/841 |
| 5,929,521 | A  | * | 7/1999 | Wark et al. ................... 257/737 |
| 6,809,421 | B1 | * | 10/2004 | Hayasaka et al. ........... 257/777 |
| 7,492,945 | B2 | * | 2/2009 | Yamazaki et al. ........... 382/187 |
| 7,649,369 | B2 | * | 1/2010 | Okumura et al. ............ 324/756 |
| 2004/0238927 | A1 | * | 12/2004 | Miyazawa .................. 257/678 |
| 2009/0035929 | A1 | * | 2/2009 | Yuzawa et al. .............. 438/613 |

FOREIGN PATENT DOCUMENTS

JP    2002-313985    * 10/2002

* cited by examiner

*Primary Examiner*—David Nhu
(74) *Attorney, Agent, or Firm*—Rankin, Hill & Clark LLP

(57) ABSTRACT

A method includes a step of forming a bump 104 having a projection 104B on an electrode pad 103 provided on a semiconductor chip 101, a step of exposing a part of the projection 104B to an upper surface of an insulating layer 105 formed on the semiconductor chip 101, a step of forming a conductive layer 107A on the upper surface of the insulating layer 105 and an exposed part of a tip portion 104D, a step of removing a protruded portion of the conductive layer 107A which is opposed to the tip portion 104D by means of a grinding roll 112, thereby exposing the projection from the conductive layer 107A, and a step of forming a conductive layer 108A through electrolytic plating using the conductive layer 107A as a feeding layer and patterning the conductive layer 108A.

16 Claims, 8 Drawing Sheets

METHOD OF MANUFACTURING ELECTRONIC DEVICE, SUBSTRATE AND SEMICONDUCTOR DEVICE

BACKGROUND OF THE INVENTION

The present application claims priority from JP 2007-072706 filed on Mar. 20, 2007. The present invention relates to a method of manufacturing an electronic device, and a substrate and a semiconductor device, and more particularly to a method of manufacturing an electronic device having a structure in which a substrate body and a conductive pattern formed thereon through an insulating layer are connected to each other by using a bump, and a substrate and a semiconductor device.

For example, there have been provided various electronic apparatuses in which an electrode and a conductive pattern are formed on a substrate such as a semiconductor substrate or a glass board. As one of them, a semiconductor device referred to as a chip size package has been provided (for example, see Patent Document 1).

The chip size package has a structure in which a rewiring (a wiring for packaging) is formed through a passivation layer (a protecting layer) on a device forming surface of a semiconductor chip obtained by dicing a wafer to be a semiconductor substrate.

In order to manufacture a chip size package disclosed in the Patent Document 1, moreover, a plurality of electrodes is first formed on a semiconductor chip region of a semiconductor wafer and a bump is formed on each of the electrodes.

The bump is formed by a bonding wire using a bonding device. For a specific forming procedure, in the bonding device, a bonding wire extended from a capillary is first bonded to an electrode pad and the capillary is subsequently lifted while the bonding wire is reeled out, and the bonding wire thus reeled out is then cut to form a bump.

For this reason, the bump formed by the bonding wire has a variation in a height from a surface (the electrode pad) on which the bump is formed and it is hard to form a rewiring to be connected to the bump in this state. As a next step, therefore, there is carried out a processing (a leveling processing) for applying a load to each formed bump in a lump to substantially flatten an upper part of the bump.

Subsequently, a semiconductor wafer having the bump formed thereon is covered with a resin, and furthermore, the resin is polished to expose an upper surface of the bump from the resin. Then, a solder ball is formed on each bump exposed from the resin, and thereafter, the semiconductor wafer is subjected to a dividing processing (a dicing processing) every semiconductor chip region so that a chip size package is manufactured.

[Patent Document 1]
  JP-A-2002-313985
  In a method according to the Patent Document 1, however, it is necessary to carry out the leveling processing for applying a load to each bump in a lump, thereby flattening an upper part of the bump in order to correct a variation in a height of the bump. For this reason, there is a problem in that a manufacturing process is complicated.

In the method according to the Patent Document 1, moreover, an insulating layer is formed to cover the bump. Therefore, there is required a polishing step of polishing the insulating layer to expose the bump. In order to form a rewiring after the polishing step, moreover, a processing (a so-called desmear processing) for roughening a surface of the insulating layer is required when a nonelectrolytic plating method is used, for example. For this reason, a processing for forming a plated layer is complicated. As a result, a manufacturing cost of a semiconductor device is increased.

Moreover, it is also possible to form a conductive layer by a sputtering method or a CVD method. Since the methods require an expensive film forming apparatus having a vacuum treating container, however, the manufacturing cost is increased. For this reason, they are not practical.

SUMMARY OF THE INVENTION

In consideration of the respects, it is an object of the invention to provide a method of manufacturing an electronic device which can be manufactured at a low cost and has a high reliability, and a substrate and a semiconductor device.

In order to solve the problems, the invention features that the following means is taken.

According to a first aspect of the invention, there is provided with a method of manufacturing an electronic device including:
  a first step of forming a bump having a projection on an electrode pad provided on a substrate body;
  a second step of forming an insulating layer on the substrate body and exposing a part of the projection to an upper surface of the insulating layer;
  a third step of forming a conductive layer on the upper surface of the insulating layer and the exposed portion of the projection;
  a fourth step of removing a protruded portion of the conductive layer which is opposed to the projection by machining and exposing the projection from the conductive layer; and
  a fifth step of forming a wiring layer through electrolytic plating using the conductive layer as a feeding layer and patterning the wiring layer to form a conductive pattern connected to the bump.

Moreover, according to a second aspect of the invention, there is provided with the method of manufacturing an electronic device according to the first aspect of the invention, wherein
  the substrate body is a semiconductor substrate.

Furthermore, according to a third aspect of the invention, there is provided with the method of manufacturing an electronic device according to the first or second aspect of the invention, wherein
  the machining executed at the fourth step is a grinding processing.

In addition, according to a fourth aspect of the invention, there is provided with the method of manufacturing an electronic device according to the third aspect of the invention, wherein
  a cutting position of a grinding stone to be used in the grinding processing is set to be higher than a non-opposing position of the conductive layer to the projection and to be lower than an opposing position of the conductive layer to the projection.

Moreover, according to a fifth aspect of the invention, there is provided with the method of manufacturing an electronic device according to any of the first to fourth aspects of the invention, wherein
  the bump is formed by a bonding wire at the first step.

Furthermore, according to a sixth aspect of the invention, there is provided with a substrate including:
  a substrate body provided with an electrode pad;
  a bump having a projection and formed on the electrode pad;
  an insulating layer formed on the substrate body;
  a conductive layer formed on the insulating layer; and a conductive pattern formed on the conductive layer and connected to the bump, wherein a tip surface of the projection is on the level with an upper surface of the conductive layer.

In addition, according to a seventh aspect of the invention, there is provided with a semiconductor device including:

a semiconductor chip provided with an electrode pad;

a bump having a projection and formed on the electrode pad;

an insulating layer formed on the semiconductor chip;

a conductive layer formed on the insulating layer; and a conductive pattern formed on the conductive layer and connected to the bump, wherein a tip surface of the projection is on the level with an upper surface of the conductive layer.

According to the invention, the conductive layer is formed on the upper surface of the insulating layer and the upper part of the exposed portion of the projection, and the protruded portion opposed to the projection is removed by the machining to expose the projection from the conductive layer. Therefore, the height of each projection from the substrate body is uniform and is on the level with the upper surface of the conductive layer. Consequently, a leveling processing required conventionally is unnecessary and a polishing step of exposing the projection of the bump from the insulating layer is also unnecessary. Thus, a manufacturing process can be simplified and a manufacturing cost can be reduced.

When the protruded portion of the conductive layer which is opposed to the projection is removed by the machining, moreover, the tip of the projection becomes on the level with the upper surface of the conductive layer. Therefore, it is possible to form the conductive pattern immediately after executing the fourth step. Consequently, the manufacturing process can be simplified.

DETAILED DESCRIPTION OF THE PREFERRED EMBODIMENT

Next, the best mode for carrying out the invention will be described with reference to the drawings.

Figure 1A:
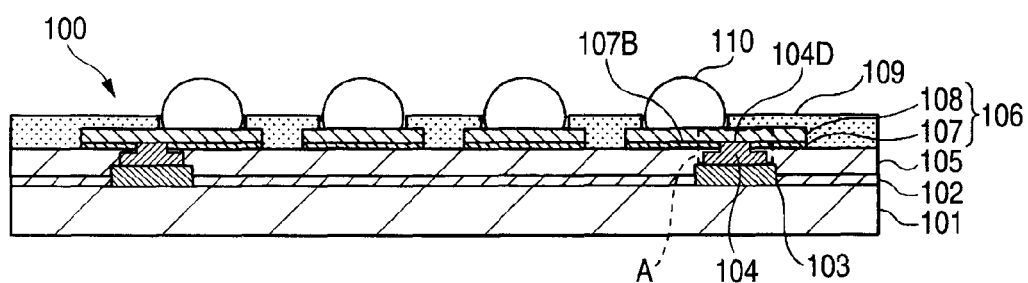
FIG. 1A is a sectional view showing a semiconductor device according to an example of the invention.

FIG. 1A is a sectional view showing a semiconductor device 100 according to an example of the invention. With reference to FIG. 1A, the semiconductor device 100 according to the example has a schematic structure in which an insulating layer 105 and a conductive pattern 106 are provided on a protecting layer (a passivation layer) 102 of a semiconductor chip 101 on which an electrode pad 103 is formed.

The conductive pattern 106 is referred to as a so-called rewiring in some cases, and is used in packaging for the semiconductor chip 101. The insulating layer 105 is constituted by an epoxy based resin, for example. The conductive pattern 106 has such a structure that a first conductive pattern 107 and a second conductive pattern 108 which are formed of Cu are laminated, for example.

The conductive pattern 106 formed on the insulating layer 105 is connected to a projection (which will be described below) of a bump 104 formed of Au, for example, and provided on the electrode pad 103. More specifically, the conductive pattern 106 is connected to an electronic circuit of the semiconductor chip 101 through the bump 104. The bump 104 is formed by a bonding wire using a wire bonding device, for example.

Moreover, a solder bump 110 is formed on the conductive pattern 106. Furthermore, a solder resist layer (an insulating layer) 109 is formed to cover the insulating layer 105 and a part of the conductive pattern 106 around the solder bump 110.

Figure 1B:
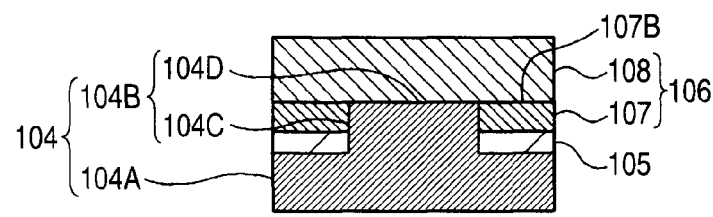
FIG. 1B is a sectional view showing the enlarged vicinity of a bump in FIG. 1A.

FIG. 1B shows an A portion (the vicinity of the bump 104) of the semiconductor device 100 which is enlarged. As shown in FIG. 1B, the bump 104 is constituted by a bump body 104A to be connected (bonded) to the electrode pad 103 and a projection 104B which is protruded from the bump body 104A.

The bump 104 is formed by a bonding wire constituted by Au, for example, using the wire bonding device. The wire bonding device continuously bonds the bonding wire to the electrode pad 103 and cuts the bonding wire after the bonding, thereby forming the bump body 104A to be bonded to the electrode pad 103 and the projection 104B which is protruded from the bump body 104A.

In the semiconductor device 100 according to the example, the projection 104B is formed to include a flat tip portion 104D formed on a tip of the projection 104B and a connecting portion 104C provided between the tip portion 104D and the bump body 104A. The semiconductor device 100 according to the example has a structure in which the projection 104B is inserted in the conductive pattern 106 and features that the tip portion 104D of the projection 104B which is inserted is on the level (the same plane) with an upper surface 107B of the first conductive pattern 107.

By the structure, the first conductive pattern 107 and the second conductive pattern 108 formed on the tip portion 104D can be a uniform and flat conductive layer having no step. Consequently, an electrical characteristic of the second conductive pattern 108 can be stabilized and a height of the solder bump 110 to be formed thereon can be made uniform. Moreover, the tip portion 104D of the projection 104B is on the level (the same surface) with the upper surface 107B of the first conductive pattern 107 so that a fine wiring can be obtained.

Figure 2:
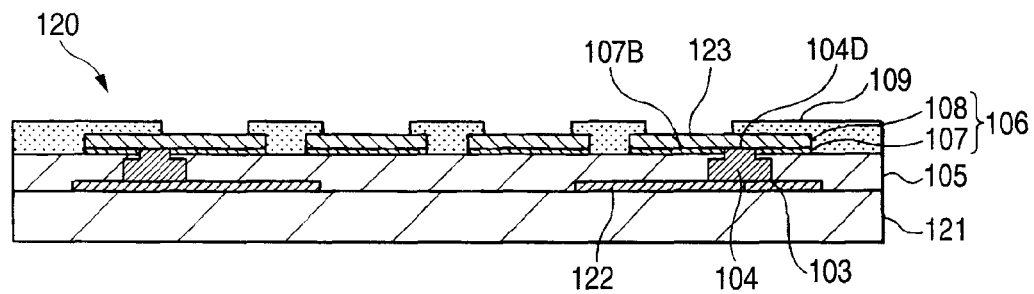
FIG. 2 is a sectional view showing a circuit board according to an example of the invention.

On the other hand, FIG. 2 shows a circuit board 120 according to an example of the invention. In FIG. 2, structures corresponding to the structures shown in FIGS. 1A and 1B have the same reference numerals and description thereof will be partially omitted.

The circuit board 120 according to the example has a schematic structure in which an insulating layer 105 and a conductive pattern 106 are laminated on a glass board 121 on which a surface electrode 122 is formed. Moreover, a bump 104 is formed in a predetermined position on the surface electrode 122 formed on an upper surface of the glass board 121.

Also in the example, the insulating layer 105 is formed by an epoxy based resin, for example, and the conductive pattern 106 has such a structure that a first conductive pattern 107 formed of Cu and a second conductive pattern 108 are laminated.

The conductive pattern 106 formed on the insulating layer 105 is connected to a tip portion 104D of the bump 104 formed on the surface electrode 122. More specifically, the conductive pattern 106 is connected to the surface electrode 122 through the bump 104. Moreover, a solder resist layer (an insulating layer) 109 is formed on a top of each of the insulating layer 105 and the conductive pattern 106, and a predetermined part thereof is opened so that the conductive pattern 106 is exposed and an external electrode 123 is formed.

Also in the circuit board 120 according to the example, the tip portion 104D of a projection 104B and an upper surface 107B of the first conductive pattern 107 are constituted to be on the level (the same surface) with each other. By the structure, the second conductive pattern 108 formed on the first conductive pattern 107 and the tip portion 104D can be set to be a smooth pattern having no concavo-convex portion. Thus, an electrical characteristic can be stabilized.

While both the first conductive pattern 107 and the second conductive pattern 108 are formed of Cu in each of the examples, it is also possible to constitute them by materials other than Cu. Moreover, the first conductive pattern 107 and the second conductive pattern 108 may be formed by different metallic materials (alloy materials) and the conductive pattern 106 may have a laminating structure of the different materials.

Next, a method of manufacturing an electronic device according to an example of the invention will be described with reference to FIGS. 3A to 3M and FIGS. 4A to 4D.

By taking, as an example of the electronic device, the semiconductor device 100 shown in FIG. 1A, description will be given to a method of manufacturing the semiconductor device 100. In FIGS. 3A to 3M and FIGS. 4A to 4D to be used in the following description, moreover, corresponding structures to the structures shown in FIGS. 1A, 1B and 2 used in the description have the same reference numerals and a part of the description will be omitted.

In order to manufacture the semiconductor device 100, at a step shown in FIG. 3A, a semiconductor substrate 101A (which is a wafer and will be hereinafter referred to as a substrate 101A) having a plurality of regions 101a provided with an electronic circuit (like a grid, for example) is first manufactured by using a well-known method.

The region 101a corresponds to a semiconductor chip 101. An electrode pad 103 is formed on a device forming surface 101b on which an electronic circuit is formed in the region 101a. Moreover, a protecting layer (a passivation layer) 102 formed of SiN ($Si_3N_4$) is provided in a portion other than the electrode pad 103 in the device forming surface 101b. Consequently, the device forming surface 101b can be protected.

Figure 3A:
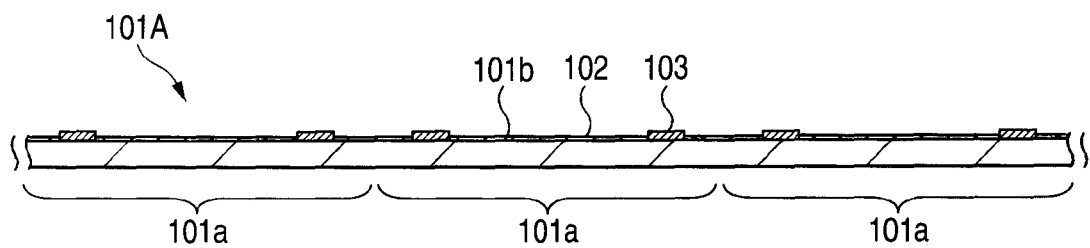
FIG. 3A is a sectional view (No. 1) for explaining a method of manufacturing a semiconductor device according to an example of the invention.
Figure 3B:
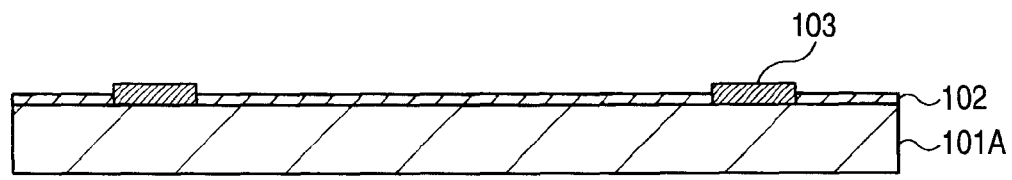
FIG. 3B is a sectional view (No. 2) for explaining the method of manufacturing a semiconductor device according to the example of the invention.

FIG. 3B shows the enlarged region 101a of the substrate 101A illustrated in FIG. 3A. In FIG. 3B and subsequent drawings, the enlarged region 101a is shown for simplicity of the illustration and description.

Figure 3C:
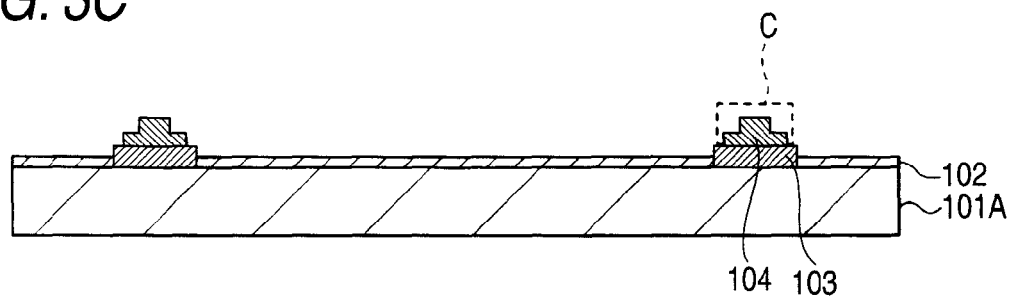
FIG. 3C is a sectional view (No. 3) for explaining the method of manufacturing a semiconductor device according to the example of the invention.

At a step shown in FIG. 3C, the bump 104 is formed on the electrode pad 103 by using a wire bonding device, for example. The bump 104 is formed by a bonding wire constituted by Au.

Figure 4A:
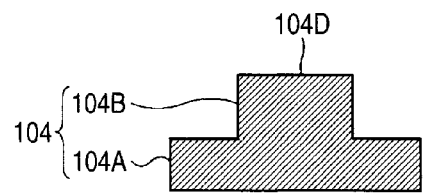
FIG. 4A is a sectional view (No. 14) for explaining the method of manufacturing a semiconductor device according to the example of the invention.

FIG. 4A shows a C portion (the bump 104) of FIG. 3C which is enlarged. The wire bonding device continuously bonds the bonding wire to the electrode pad 103 and cuts the bonding wire thus bonded, thereby forming a bump body 104A to be bonded to the electrode pad 103 and the projection 104B which is protruded from the bump body 104A.

Figure 3D:
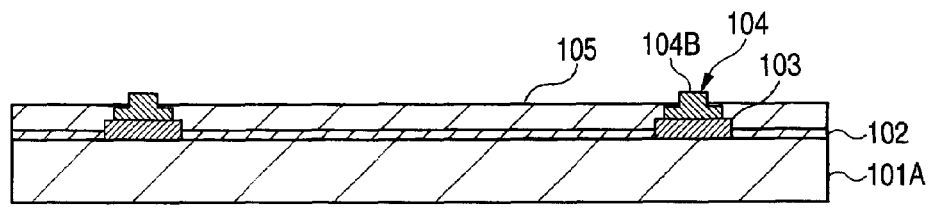
FIG. 3D is a sectional view (No. 4) for explaining the method of manufacturing a semiconductor device according to the example of the invention.

At a step shown in FIG. 3D, next, the insulating layer 105 formed by an epoxy based resin material, for example, is provided on the substrate 101A (the protecting layer 102). The insulating layer 105 is formed by lamination (pasting) or application, for example. In this case, the insulating layer 105 is formed in such a manner that the projection 104B of the bump 104 is exposed from an upper surface of the insulating layer 105.

For this reason, it is preferable to use, for the insulating layer 105, a soft resin material to which a hardness regulating material such as a filler referred to as NCF is rarely added. By using the soft resin material, it is possible to reliably expose the projection 104B from the insulating layer 105. Moreover, a thickness of the insulating layer 105 is also selected in such a manner that the projection 104B is reliably protruded from the upper surface of the insulating layer 105 in the formation of the insulating layer 105.

The insulating layer 105 is not restricted to the material but can be formed by using various insulating materials (resin materials). For example, it is also possible to use, for the insulating layer 105, a so-called built-up resin (an epoxy resin containing a filler) which is usually utilized or a resin material which is referred to as ACF.

Figure 3E:
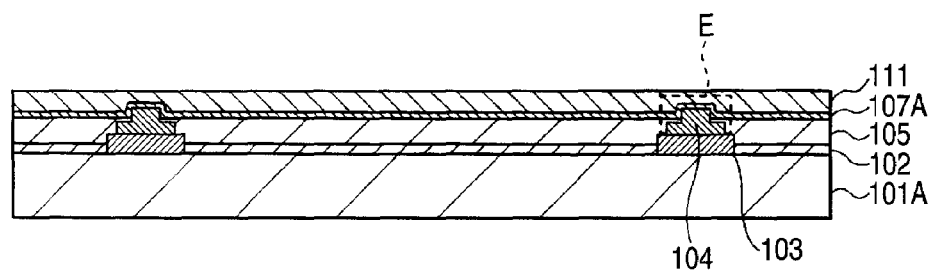
FIG. 3E is a sectional view (No. 5) for explaining the method of manufacturing a semiconductor device according to the example of the invention.

At a step shown in FIG. 3E, next, a conductive layer 107A formed by a thin copper foil is stuck onto the insulating layer 105, for example. The conductive layer 107A is stuck to the insulating layer 105 in a state in which a support layer 111 formed of Cu is laminated thereon, for example, (a state in which the conductive layer 107A is supported by the support layer 111).

Figure 4B:
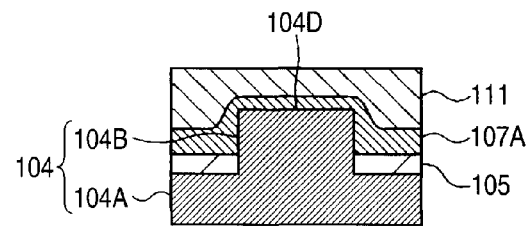
FIG. 4B is a sectional view (No. 15) for explaining the method of manufacturing a semiconductor device according to the example of the invention.

FIG. 4B shows an E portion (the vicinity of the bump 104) of FIG. 3E which is enlarged. As shown in FIG. 4B, at the step, the conductive layer 107A is pushed up by the bump 104 and is thus brought into a swelling state toward the support layer 111 side.

Figure 3F:
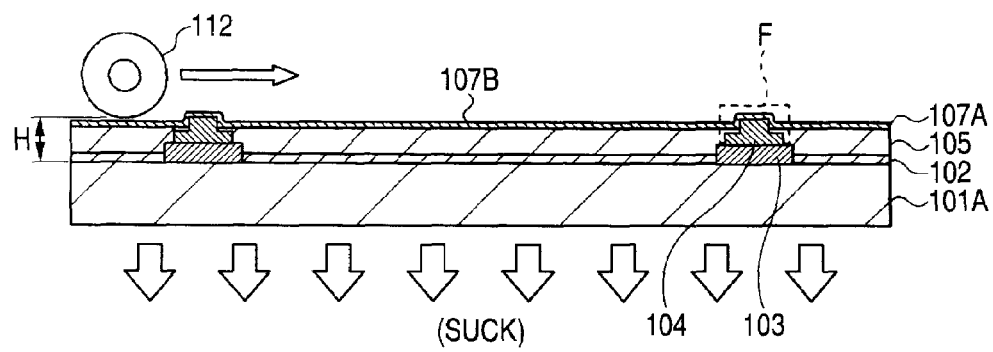
FIG. 3F is a sectional view (No. 6) for explaining the method of manufacturing a semiconductor device according to the example of the invention.
Figure 4C:
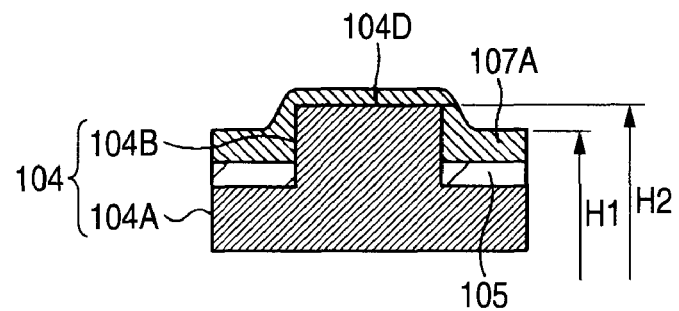
FIG. 4C is a sectional view (No. 16) for explaining the method of manufacturing a semiconductor device according to the example of the invention.

Next, the support layer 111 supporting the conductive layer 107A is removed. FIG. 3F shows a state in which the support layer 111 is removed. Moreover, FIG. 4C shows an F portion (the vicinity of the bump 104) of FIG. 3F which is enlarged. By the removal of the support layer 111, there is brought a state in which only the conductive layer 107A is formed on the insulating layer 105. In this case, a flat surface is provided in a position of the conductive layer 107A which is not opposed to the bump 104 (a non-opposing position which is not projective), and the conductive layer 107A is pushed up by the bump 104 and is thus swollen as described above in a position opposed to the bump 104 (an opposing position which is projective).

Moreover, an arrow H1 shown in FIG. 4C indicates a height from the upper surface of the substrate 101A to the upper surface of the conductive layer 107A in the non-opposing position. Furthermore, an arrow H2 shown in FIG. 4C indicates a height from the upper surface of the substrate 101A to the tip portion 104D of the bump 104. In the example, the heights H1 and H2 are set to be H1<H2.

When the support layer 111 is removed as described above, a grinding processing to be machining is carried out over the upper surface of the substrate 101A. FIG. 3F shows a state in which the substrate 101A is attached to a grinding apparatus. In the attaching state, the substrate 101A is sucked by an adsorbing table which is not shown and is thus fixed. Subsequently, a grinding roll 112 is used and is moved in a direction of an arrow in the drawing so that the grinding processing is carried out.

The grinding roll 112 is obtained by baking and hardening an abrasive grain. By rotating and moving the grinding roll 112, it is possible to carry out the grinding processing over a surface of a workpiece. In the example, a height (represented by H) from the upper surface of the substrate 101A in a position in which the grinding operation of the grinding roll 112 is carried out (which is referred to as a grinding position) is set to be equal to or slightly greater than the height H1 (which will be hereinafter referred to as an upper surface height H1) from the upper surface of the substrate 101A to the upper surface 107B in the non-opposing position of the conductive layer 107A and is set to be smaller than the height H2 (which will be hereinafter referred to as a projection height H2) from the upper surface of the substrate 101A to the tip portion 104D of the bump 104 (H1≦H<H2).

Figure 3G:
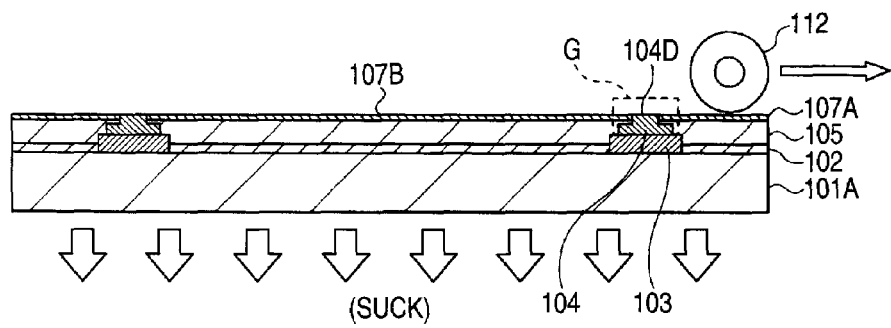
FIG. 3G is a sectional view (No. 7) for explaining the method of manufacturing a semiconductor device according to the example of the invention.

Thus, the grinding position of the grinding roll 112 is set and the grinding roll 112 is moved from a position shown in FIG. 3F to a position shown in FIG. 3G. Consequently, the portion of the conductive layer 107A which is opposed to the bump 104 (the projection 104B) and is thus swollen is ground by the grinding roll 112.

In this case, the grinding position H is higher than the height H1 of the upper surface and is lower than the height H2 of the projection (H1≦H<H2) as described above. Therefore, the grinding processing is rarely carried out over the upper surface 107B of the conductive layer 107A. On the other hand, the conductive layer 107A and the projection 104B are ground (removed) by the grinding roll 112 in the opposing position in which the conductive layer 107A is swollen from the upper surface 107B.

Figure 4D:
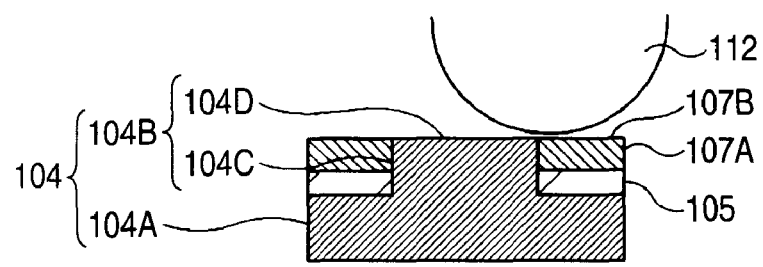
FIG. 4D is a sectional view (No. 17) for explaining the method of manufacturing a semiconductor device according to the example of the invention.

FIG. 3G shows a state in which the grinding processing of the grinding roll 112 is carried out as described above. Moreover, FIG. 4D shows a G portion (the vicinity of the bump 104) of FIG. 3G which is enlarged. As shown in each drawing, the grinding processing is carried out by the grinding roll 112 on the condition described above. Thus, the conductive layer 107A and the tip portion 104D of the bump 104 in the opposing position are removed through the grinding processing. Consequently, the tip portion 104D of the bump 104 is exposed from the conductive layer 107A, and the exposed tip portion 104D and the upper surface 107B of the conductive layer 107A have no concavo-convex portion and are on the level with each other.

In the fixation of FIG. 3C described above, a plurality of bumps 104 is formed on the substrate 101A. All of the bumps 104 are subjected to the grinding processing by the grinding roll 112 having the grinding position H to be constant. Consequently, all of the projection heights H2 of the tip portions 104D of the respective bumps 104 (which are the heights from the upper surface of the substrate 101A) are equal to each other. In the example, thus, it is possible to cause the projection heights H2 of all of the bumps 104 to be equal to each other without executing a leveling processing which has conventionally been carried out.

It has been known that the bump 104 formed by using a wire bonding method (a bonding wire) has a high productivity and a comparatively great variation in the height. Also in the bump 104, it is possible to easily cause the projection heights H2 of the bumps 104 to be equal to each other at a simple step by using the manufacturing method according to the example. Thus, it is possible to enhance the reliability of the semiconductor device 100 to be manufactured. The conductive layer 107A is used as a feeding layer (a seed layer) at an electrolytic plating step which will be described below.

Figure 3H:
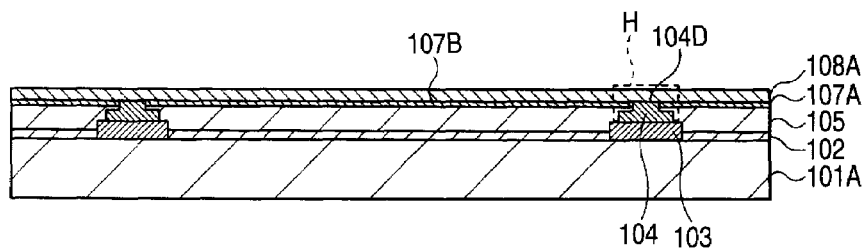
FIG. 3H is a sectional view (No. 8) for explaining the method of manufacturing a semiconductor device according to the example of the invention.
Figure 3I:
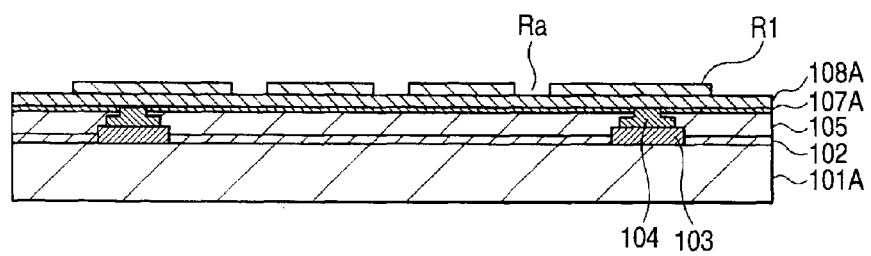
FIG. 3I is a sectional view (No. 9) for explaining the method of manufacturing a semiconductor device according to the example of the invention.
Figure 3J:
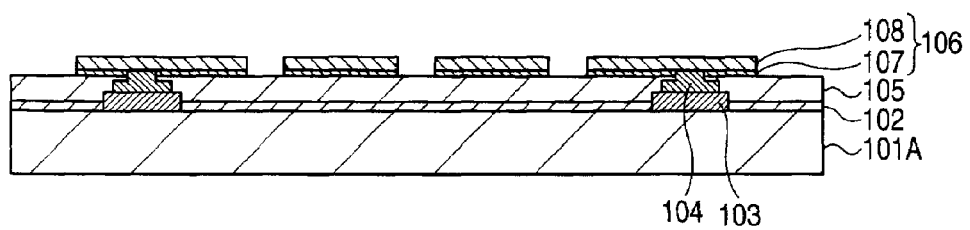
FIG. 3J is a sectional view (No. 10) for explaining the method of manufacturing a semiconductor device according to the example of the invention.

At steps shown in FIGS. 3H to 3J, next, the conductive pattern 106 to be connected to the bump 104 is formed through electrolytic plating using the conductive layer 107A as the feeding layer (the seed layer).

A method of forming the conductive pattern 106 includes a so-called subtractive process and a so-called semiadditive process, for instance. In the example, description will be given to an example in which the subtractive process is used.

Figure 4E:
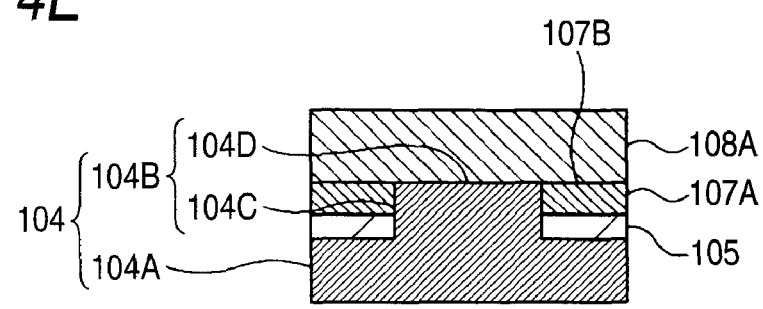
FIG. 4E is a sectional view (No. 18) for explaining the method of manufacturing a semiconductor device according to the example of the invention.

At the step shown in FIG. 3H, first of all, a conductive layer 108A formed of Cu, for example, is laminated on the conductive layer 107A and the tip portion 104D through the electrolytic plating using the conductive layer 107A as the feeding layer. As described above, the tip potion 104D is on the level with the upper surface 107B of the conductive layer 107A. Therefore, the conductive layer 108A thus formed is a flat and excellent layer having no concavo-convex portion. FIG. 4E shows an H portion (the vicinity of the bump 104) of FIG. 3H which is enlarged.

At the step shown in FIG. 3I, next, a mask pattern R1 having an opening portion Ra is formed on the conductive layer 108A. The mask pattern R1 can be provided by forming a resist layer through application or sticking of a film and patterning the resist layer using a photolithography.

At the step shown in FIG. 3J, subsequently, the conductive layers 107A and 108A are subjected to pattern etching using the mask pattern R1 as a mask. Consequently, the first conductive pattern 107 and the second conductive pattern 108 are laminated and the conductive pattern 106 connected to the bump 104 is formed.

While the first conductive pattern 107 has a thickness of approximately 2 to 3 μm and the second conductive pattern 108 has a thickness of approximately 30 to 40 μm, for example, the numeric values are only illustrative and the invention is not restricted to the numeric values.

In the formation of the conductive pattern 106, the conductive layer 107A is used as the feeding layer so that the electrolytic plating can easily be used. For example, in the case in which the feeding layer (the seed layer) is formed by non-electrolytic plating, a processing for roughening the surface of the insulating layer (a so-called desmear processing) is required. As a result, a processing for forming a plated layer is complicated. In the case in which the feeding layer is formed by sputtering, moreover, an expensive film forming apparatus having a vacuum treating container is required. Thus, a manufacturing cost is increased.

On the other hand, in the method according to the example, the desmear processing and the sputtering processing in a vacuum chamber are not required and the feeding layer (the conductive layer 107A) can easily be formed by a simple method. According to the method, therefore, the semiconductor device can simply be manufactured so that the manufacturing cost can be reduced.

Figure 3K:
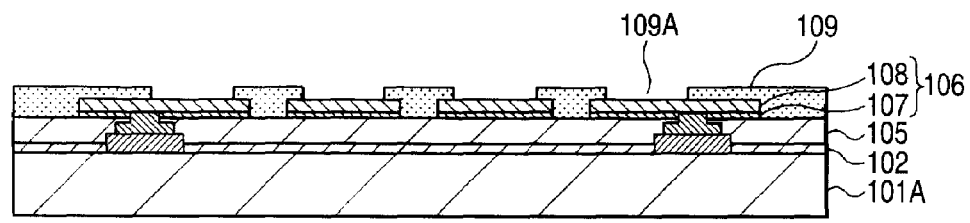
FIG. 3K is a sectional view (No. 11) for explaining the method of manufacturing a semiconductor device according to the example of the invention.

At the step shown in FIG. 3K, then, a surface of the conductive pattern 106 (Cu) is subjected to a roughening processing if necessary, and the solder resist layer (an insulating layer) 109 having an opening portion 109A is thereafter formed on the insulating layer 105. A part of the conductive pattern 106 is exposed from the opening portion 109A.

Figure 3L:
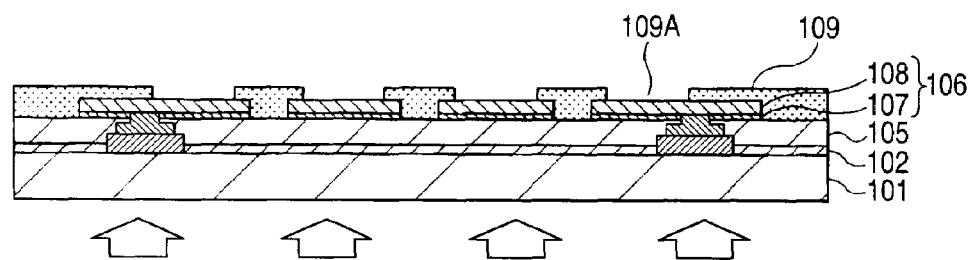
FIG. 3L is a sectional view (No. 12) for explaining the method of manufacturing a semiconductor device according to the example of the invention.

At the step shown in FIG. 3L, next, a back face of the substrate 101A is ground and the substrate 101A is caused to have a predetermined thickness if necessary.

Figure 3M:
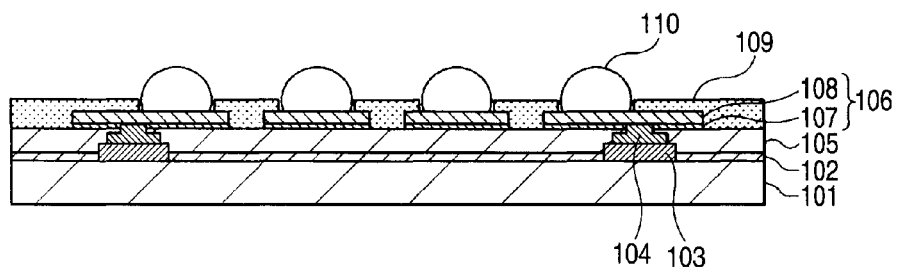
FIG. 3M is a sectional view (No. 13) for explaining the method of manufacturing a semiconductor device according to the example of the invention.

At the step shown in FIG. 3M, subsequently, a solder bump 110 is formed on the conductive pattern 106 exposed from the opening portion 109A if necessary. Furthermore, the substrate 101A is subjected to dicing to divide the semiconductor chip into individual pieces. Consequently, it is possible to manufacture the semiconductor device 100 shown in FIG. 1A.

Although the conductive pattern 106 is formed by the subtractive process in the manufacturing method, the conductive pattern 106 may be formed by using the semiadditive process. In this case, for example, it is preferable that the steps shown in FIGS. 3A to 3G should be executed in the manufacturing method and steps which will be described below should be then executed in place of the steps shown in FIGS. 3H to 3J.

Figure 5:
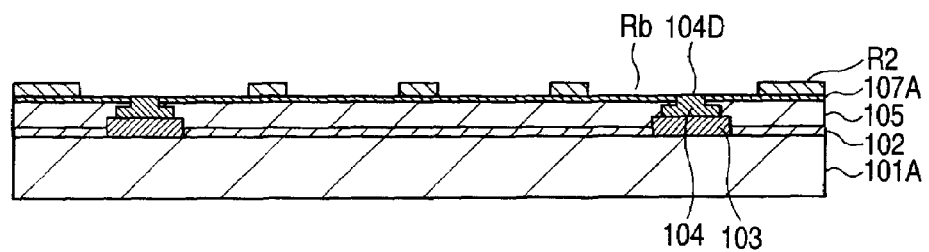
FIG. 5 is a sectional view (No. 1) for explaining a variant of the method of manufacturing a semiconductor device according to the example of the invention.

More specifically, as shown in FIG. 5, a mask pattern R2 having an opening portion Rb is formed on the conductive layer 107A. The mask pattern R2 can be provided by forming a resist layer through application or sticking of a film and patterning the resist layer using the photolithography.

Next, the electrolytic plating using the conductive layer 107A as the feeding layer (the seed layer) is executed to form a second conductive pattern on the conductive layer 107A exposed from the opening portion Rb. Thereafter, the mask pattern R2 is peeled and the excessive feeding layer 107A which is exposed by peeling the mask pattern R2 is further removed by etching. Consequently, it is possible to form the conductive pattern 106 shown in FIG. 3J.

While the insulating layer 105 is formed on the substrate 101A and the conductive layer 107A is then stuck onto the insulating layer 105 at the steps shown in FIGS. 3D and 3E in the manufacturing method, moreover, a lamination in which the insulating layer 105 and the conductive layer 107A are previously provided may be stuck to the substrate 101A.

In this case, for example, it is preferable that the steps shown in FIGS. 3A to 3C should be executed and steps which will be described below should be then executed in place of the steps shown in FIGS. 3D and 3E in the manufacturing method.

Figure 6:
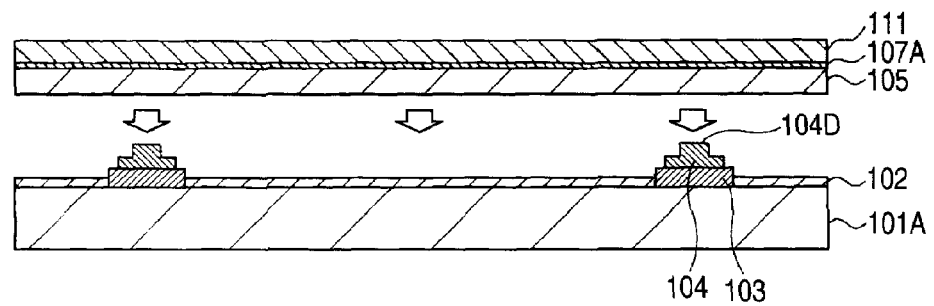
FIG. 6 is a sectional view (No. 2) for explaining a variant of the method of manufacturing a semiconductor device according to the example of the invention.

More specifically, as shown in FIG. 6, the insulating layer 105 and the conductive layer 107A which are laminated on the support layer 111 may be stuck to the substrate 101A. By executing the steps shown in FIG. 3F and the succeeding drawings described above, thereafter, it is possible to form the semiconductor device 100.

While the invention has been described above based on the preferred examples, the invention is not restricted to the specific examples but various modifications and changes can be made without departing from the scope of claims. More specifically, it is also possible to use, for the substrate 101A, a glass board or a multilayer wiring board in place of the semiconductor substrate. Consequently, it is possible to carry out an application to various electronic devices using the boards.

What is claimed is:

1. A method of manufacturing an electronic device comprising:

a first step of forming a bump having a projection on an electrode pad provided on a substrate body;

a second step of forming an insulating layer on the substrate body such that an exposed portion of the projection projects through and is exposed from an upper surface of the insulating layer;

a third step of forming a first conductive pattern on the upper surface of the insulating layer and the exposed portion of the projection, wherein a portion of the first conductive pattern on the exposed portion of the projection forms a protruding portion of the first conductive pattern;

a fourth step of removing the protruding portion of the first conductive pattern by machining, such that a tip surface of the projection is exposed through the first conductive pattern, and the tip surface of the projection is level with an upper surface of the first conductive pattern provided on the upper surface of the insulating layer; and a fifth step of forming a wiring layer through electrolytic plating using the first conductive pattern as a feeding layer and patterning the wiring layer to form a second conductive pattern connected to the bump.

2. The method of manufacturing an electronic device according to claim 1, wherein
the substrate body is a semiconductor substrate.

3. The method of manufacturing an electronic device according to claim 1, wherein
the machining executed at the fourth step is a grinding processing.

4. The method of manufacturing an electronic device according to claim 3, wherein
a cutting position of a grinding stone to be used in the grinding processing is set to be higher than the upper surface of the first conductive pattern provided on the upper surface of the insulating layer and to be lower than a peak of the protruding portion of the first conductive pattern.

5. The method of manufacturing an electronic device according to claim 1, wherein
the bump is formed by a bonding wire at the first step.

6. A substrate comprising:
a substrate body provided with an electrode pad;
a bump formed on the electrode pad and having a projection;
an insulating layer formed on the substrate body;
a first conductive pattern formed on the insulating layer; and
a second conductive pattern formed on the first conductive pattern and connected to the bump, wherein
a tip surface of the projection opposite from a surface of the bump formed on the electrode pad is level with and exposed from an upper surface of the first conductive pattern,
the second conductive pattern is formed on the tip surface of the projection, and
the insulating layer and first conductive pattern cooperate to encapsulate the bump while leaving the tip surface of the projection exposed therefrom.

7. The substrate according to claim 6, wherein the electrode pad is disposed between the bump and the substrate body.

8. The substrate according to claim 7, wherein the upper surface of the first conductive pattern is a surface opposite from a surface formed on the insulating layer.

9. The substrate according to claim 6, wherein the first conductive pattern and the second conductive pattern are composed of different materials.

10. The substrate according to claim 6, wherein the bump is formed by a bonding wire.

11. The substrate according to claim 6, wherein the bump comprises a bump body provided on the electrode pad, with the projection defined by side surfaces projecting from the bump body and the tip surface spaced from the bump body by the side surfaces, and
wherein the insulating layer and first conductive pattern encapsulate the bump body and the projection side surfaces, and the tip surface of the projection is exposed from the insulating layer and first conductive pattern.

12. A semiconductor device comprising:
a semiconductor chip provided with an electrode pad;
a bump formed on the electrode pad and having a projection;
an insulating layer formed on the semiconductor chip;
a first conductive pattern formed on the insulating layer; and
a second conductive pattern formed on the first conductive pattern and connected to the bump, wherein
a tip surface of the projection opposite from a surface of the bump formed on the electrode pad is level with and exposed from an upper surface of the first conductive pattern,
the second conductive pattern is formed on the tip surface of the projection, and
the insulating layer and first conductive pattern cooperate to encapsulate the bump while leaving the tip surface of the projection exposed therefrom.

13. The substrate according to claim 8, wherein the bump is formed by a bonding wire.

14. The semiconductor device according to claim 12, wherein the first conductive pattern and the second conductive pattern are composed of different materials.

15. The semiconductor device according to claim 12, wherein the bump comprises a bump body provided on the electrode pad, with the projection having side surfaces projecting from the bump body and the tip surface spaced from the bump body by the side surfaces, and
wherein the insulating layer and the first conductive pattern encapsulate the bump body and the projection side surfaces, and the tip surface of the projection is exposed from the insulating layer and the first conductive pattern.

16. The semiconductor device according to claim 12, wherein the insulating layer is disposed between the electrode pad and the first conductive pattern.

* * * * *